US006529447B1

(12) United States Patent
Anil et al.

(10) Patent No.: US 6,529,447 B1
(45) Date of Patent: Mar. 4, 2003

(54) COMPENSATION OF CRYSTAL START UP FOR ACCURATE TIME MEASUREMENT

(75) Inventors: K. S. Anil, Bangalore (IN); Thomas K. Mathew, Bangalore (IN); Pradeep Mishra, San Diego, CA (US); Rajat Gupta, Bangalore (IN)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/596,522

(22) Filed: Jun. 19, 2000

(51) Int. Cl.[7] .......................... G04F 5/00; G04B 17/20; H03B 19/00

(52) U.S. Cl. .......................... 368/156; 368/202; 331/49

(58) Field of Search ................................ 368/155–156, 368/107–108, 200–202; 331/46–49, 55; 713/400, 500

(56) References Cited

U.S. PATENT DOCUMENTS

| | | | | |
|---|---|---|---|---|
| 5,151,613 A | | 9/1992 | Satou et al. | 307/243 |
| 5,196,810 A | | 3/1993 | Graether et al. | 331/49 |
| 5,237,699 A | * | 8/1993 | Little et al. | 395/750 |
| 5,623,234 A | | 4/1997 | Shaik et al. | 331/49 |
| 6,157,265 A | | 12/2000 | Hanjani | 331/49 |
| 6,167,527 A | * | 12/2000 | Little et al. | 713/500 |
| 6,219,797 B1 | * | 4/2001 | Liu et al. | 713/500 |

* cited by examiner

*Primary Examiner*—Vit Miska
(74) *Attorney, Agent, or Firm*—Christopher P. Maiorana, P.C.

(57) ABSTRACT

An apparatus comprising a first circuit and a timing circuit. The first circuit may be configured to generate an output clock signal that may compensate for oscillation build-up and stabilization time after a power up. The timer circuit may be configured to provide timing in response to the output clock signal.

22 Claims, 3 Drawing Sheets

COMPENSATION OF CRYSTAL START UP FOR ACCURATE TIME MEASUREMENT

CROSS REFERENCE TO RELATED APPLICATIONS

The present application may relate to co-pending application Ser. No. 09/596,814, filed Jun. 19, 2000, which is hereby incorporated by reference in its entirety.

FIELD OF THE INVENTION

The present invention relates to a method and/or architecture for accurate time measurement generally and, more particularly, to a method and/or architecture for compensation of crystal start up for accurate time measurement.

BACKGROUND OF THE INVENTION

Conventional oscillators cannot generate an accurate system clock during a start up condition. In particular, when time keeping accuracy, frequency stability with respect to time and quick start up is required, conventional oscillators are not adequate.

In applications using microcontrollers, if an oscillator has not started up when a power-on-reset (POR) is lifted, the microcontroller can hang. A watchdog timer (WDT) has to be implemented to return the system to a normal mode of operation. Using the watchdog timer will cause significant error (i) if the system is used for time measurement from power up and/or (ii) if an application cannot tolerate the inevitable blackout associated with recovery driven by the watchdog timer.

SUMMARY OF THE INVENTION

The present invention concerns an apparatus comprising a first circuit and a timing circuit. The first circuit may be configured to generate an output clock signal that may compensate for oscillation build-up and stabilization time after a power up. The timer circuit may be configured to provide timing in response to the output clock signal.

The objects, features and advantages of the present invention include providing a method and/or architecture for compensation of crystal oscillator start up that may provide (i) high accuracy from point of power application to the chip, (ii) high accuracy over wide voltage and temperature variations, (iii) an accurate timer from power up, and/or (iv) a decreased dead time (e.g., the point beyond which the start up time is not distinguishable).

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
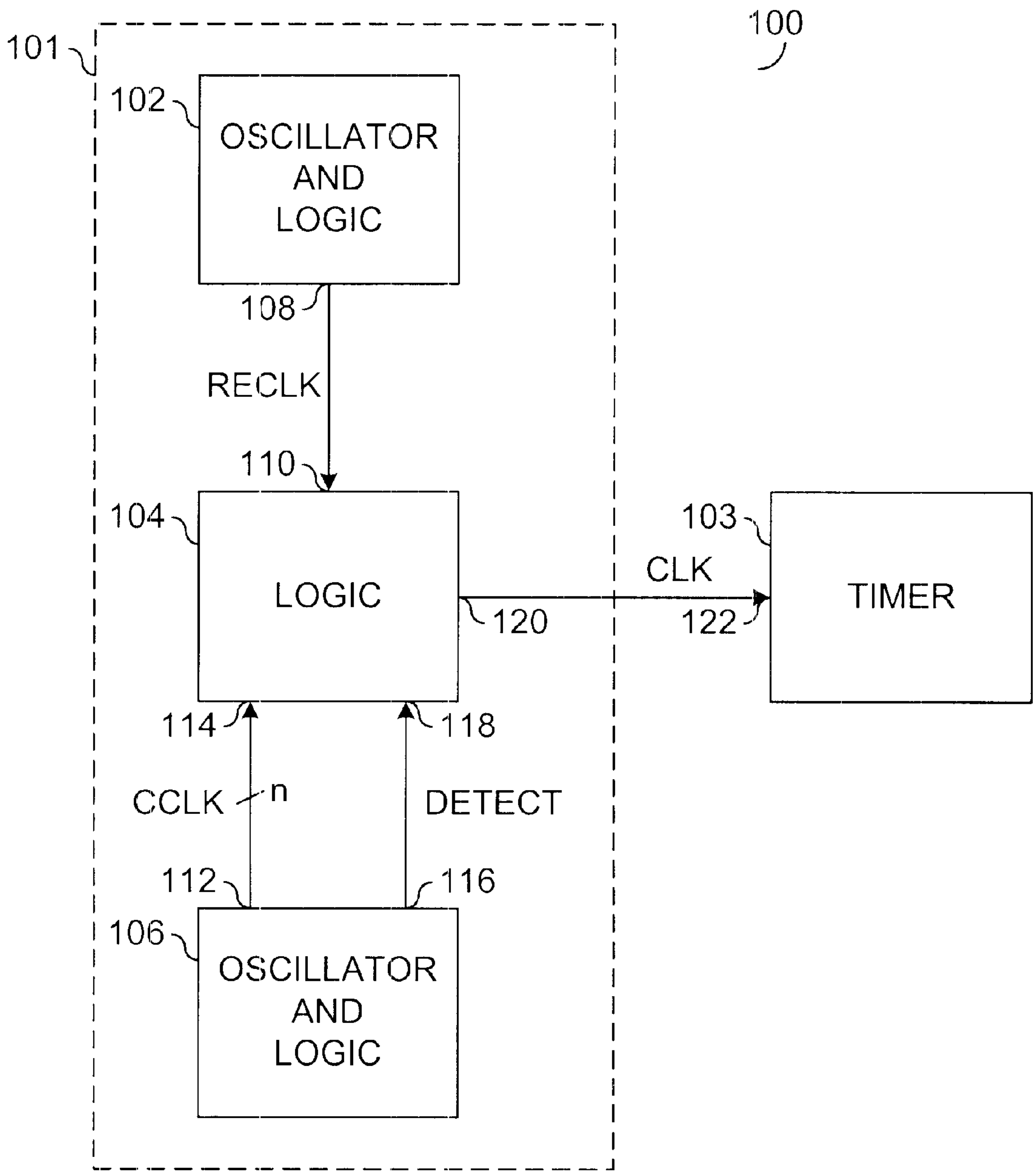
FIG. 1 is a block diagram of a preferred embodiment of the present invention.

Referring to FIG. 1, a block diagram of a circuit 100 is shown in accordance with a preferred embodiment of the present invention. The circuit 100 may be configured to compensate for oscillation start-up and stabilization time. The circuit 100 generally comprises a logic block (or circuit) 101 and a timer 103. The structure of the logic block 101 generally comprises an oscillator and logic block (or circuit) 102, a logic block (or circuit) 104 and an oscillator and logic block (or circuit) 106. The oscillator and logic block 102 may be implemented, in one example, as a relaxation oscillator (RC) and frequency multiplication function block. However, other oscillators and/or logic functions may be implemented accordingly to meet the design criteria of a particular implementation. The relaxation oscillator and logic block 102 may have an output 108 that may present a signal (e.g., RECLK). The signal RECLK may be presented to an input 110 of the logic block 104. In one example, the signal RECLK may be implemented as a relaxation oscillator (RC) reference clock.

The oscillator and logic block 106 may have an output 112 that may present a number of signals (e.g., CCLK). The signals CCLK may be presented to an input 114 of the logic block 104. In one example, the signals CCLK may be implemented as crystal reference clocks. The oscillator and logic block 106 may also have an output 116 that may present a signal (e.g., DETECT) to an input 118 of the logic block 104. The logic block 104 may have an output 120 that may present a signal (e.g., CLK). The signal CLK may be presented in response to the signal RECLK, the signals CCLK and the signal DETECT. The signal CLK may be presented to an input 122 of the timer 103. In one example, the signal CLK may be implemented as a system clock.

In general, the logic block 104 may present one of the signals CCLK generated by the oscillator and logic block 106 as the system clock CLK. The logic block 104 may select between the signals CCLK in response to the signal DETECT and the signal RECLK. Additionally, the logic block 104 may select an appropriate clock (e.g., one of the signals CCLK) after a delay. The delay may be varied in response to the signal RECLK and the signal DETECT. However, the circuit 100 may be configured to present the signal CLK in response to another appropriate signal and/or circumstance in order to meet the criteria of a particular implementation.

The circuit 100 may provide an instantaneous and accurate clock frequency (e.g., the clock CLK). The circuit 100 may provide the instantaneous and accurate clock CLK by clocking the signal RECLK into suitable logic counters during a start up stage. The circuit 100 may switch between the signals CCLK after a predetermined or dynamically calculated time delay. The time delay may allow the signals CCLK to stabilize.

The circuit 100 generally switches to another one of the signals CCLK after the oscillator and logic block 106 has stabilized. The circuit 100 may compensate for any accumulated error due to inaccuracy of the clock RECLK during the stabilization time of the crystal clock CCLK. After the compensation, clock pulses presented as the signal CLK, at any point of time, will generally be the same as if a crystal oscillator (to be described in connection with FIGS. 2 and 3) had started instantaneously. The oscillator and logic block 106 generally causes the circuit 100 to present the signal CLK from the instant the crystal clock CCLK may be stabilized.

Figure 2:
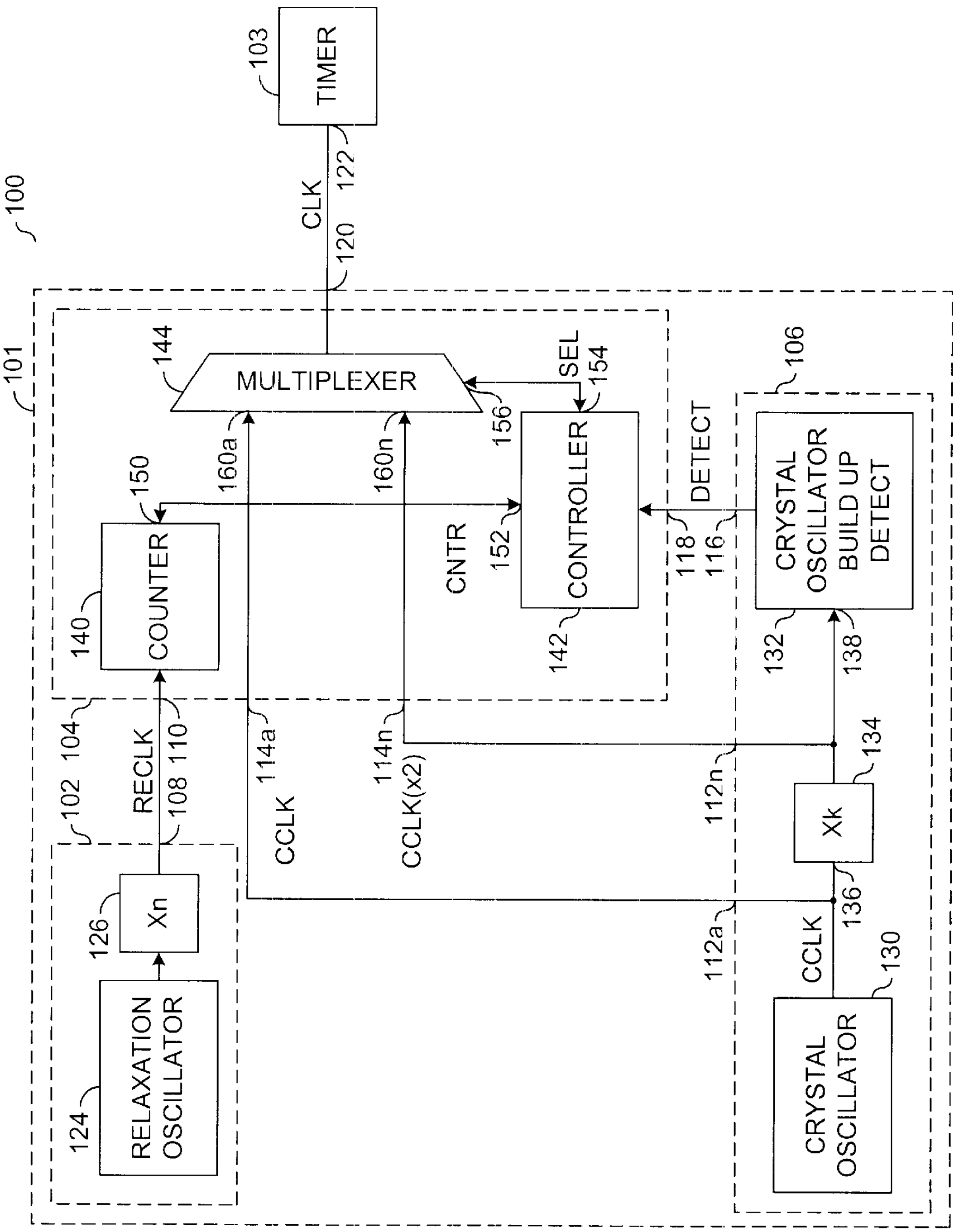
FIG. 2 is a detailed block diagram of the present invention.

Referring to FIG. 2, a more detailed diagram of the circuit 100 is shown. The oscillator and logic block 102 is shown comprising a relaxation oscillator block (or circuit) 124 and a multiplier 126. The multiplier 126 may be implemented, in one example, as a frequency multiplier. In another example, the multiplier 126 may be implemented as a multiply by K frequency multiplier, where K is an integer. However, other appropriate multipliers may be implemented in order to meet the criteria of a particular implementation. The oscillator 124 may present a signal to the multiplier 126. The multiplier 126 may multiply the signal generated by the RC oscillator 124. Additionally, the multiplier 126 may generate the signal RECLK.

The oscillator and logic circuit 106 is shown comprising a crystal oscillator 130, a crystal oscillator build up detect circuit 132 and a multiplier 134. The crystal oscillator 130 generally presents the signal CCLK to both the input 114*a* of the logic circuit 104 and to an input 136 of the multiplier 134. In one example, the multiplier 134 may be implemented as a frequency multiplier. In another example, the multiplier 134 may be implemented as a multiply by 2 frequency multiplier. In another example, the multiplier 134 may be implemented as a multiply by K frequency multiplier, where K is an integer. However, other appropriate multipliers may be implemented in order to meet the criteria of a particular implementation.

Additionally, the oscillator and logic block 106 is shown implementing a single multiplier. However, the oscillator and logic block 106 may implement any number of multipliers in order to meet the criteria of a particular implementation. The multiplier 134 may present a signal (e.g., CCLK (×2)) to the input 112*n* of the logic circuit 104 and to an input 138 of the crystal oscillator build up detect circuit 132. The crystal oscillator build up detect circuit 132 generally presents the signal DETECT in response to the signal CCLK (×2).

The circuit 100 may have the advantages of both parallel oscillators (in terms of accuracy) and of relaxation oscillators (in terms of instantaneous start up) . The switch between the signal CCLK and the signal CCLK(×2) may be controlled, in one example, by a counter. For example, a counter may count up to 20 before initiating a switch between the clocks (e.g., the signal CCLK and the signal CCLK(×2)).

Various oscillators may be implemented for the circuit 100. In one example, the relaxation oscillator 124 may be implemented as any appropriate oscillator that may start up immediately on power up. In another example, the crystal oscillator 130 may be implemented as a pierce crystal oscillator. The pierce crystal oscillator 130 may generate an accurate clock frequency after stabilizing. Once the crystal oscillator 130 has stabilized, the substitute clock (e.g., CCLK(×2)) is generally applied as the system clock CLK. The clocks CCLK and CCLK(×2) may be implemented to provide an accurate system clock CLK.

The logic circuit 104 generally comprises a counter 140, a control block (or circuit) 142 and a multiplexer 144. Alternatively, the various components of the logic block 104 may be implemented as other appropriate type devices in order to meet the criteria of a particular implementation. In one example, the counter 140 may be implemented as an up/down counter clocked by the clock RECLK and the controller 142 may be implemented as a multiplexer and counter control circuit. The multiplication factor N of the multiplier 126 may be implemented to provide an appropriate frequency to the counter 140. For example, the clock RECLK may be sufficiently high, such that the multiplier 126 may be implemented as a divider block. Additionally, the multiplier 126 may supply the frequency RECLK directly to the counter 140. However, other appropriate multiplication factors may be implemented in order to meet the criteria of a particular implementation.

The counter 140 may have an input/output 150 that may present/receive a signal (e.g., CNTR) to an input/output 152 of the controller 142. The counter 140 may indicate a count to the controller 142. Additionally, the controller 142 may control a count operation (e.g., up and/or down) of the counter 140. The controller 142 may also have an input that may receive the signal (e.g., DETECT) from the input 118. Additionally, the controller controller 142 may have an output 154 that may present a signal (e.g., SEL). The controller 142 may generate the signal SEL in response to the signal CNTR and the signal DETECT.

The multiplexer 144 may have an input 156 that may receive the signal SEL and a number of inputs 160*a*–160*n*. The input 160*a* may receive the signal CCLK. The input 160*n* may receive the signal CCLK(×2). Additionally, the multiplexer 144 may present the signal CLK. The multiplexer 144 may multiplex the signals received at the inputs 160*a*–160*n* in response to the signal SEL. The signal SEL may be implemented, in one example, as a select signal. In another example, the signal SEL may be implemented as a multi-bit signal. The multiplexer 144 may multiplex the signal CCLK and the signal CCLK(×2) to present the signal CLK. The signal CLK may provide an accurate clock frequency CLK to the timer 103.

A measure of the start up time of the crystal oscillator 130 is generally maintained by the counter 140 that may be clocked by the signal RECLK. The counter 140 may count from an initial power up to a start up of the crystal oscillator 130. The counter 140 may count up with the RC clock RECLK until the pierce crystal oscillator 130 starts up and stabilizes. After the crystal oscillator 130 stabilizes the counter 140 may count down with the RC clock RECLK. Additionally, the timer 103 may count up with 2 times the pierce oscillator frequency (e.g., the signal CCLK(×2)). However, the timer 103 may count with another multiple of the clock CCLK in order to meet the criteria of a particular implementation. When the counter 140 reaches zero, the timer clock (e.g., CCLK(×2)) may be switched to the pierce oscillator frequency (e.g., CCLK). After the switch, clock pulses presented as the signal CLK, at any point of time, will generally be the same as if the crystal oscillator clock CCLK had started instantaneously.

The circuit 100 may have a dead time before the timer 103 achieves an accurate timing. However, the dead time may be reduced by (i) increasing the clock RECLK by a multiple and (ii) increasing the timer clock CLK proportionately (to be described in connection with FIG. 3).

The RC oscillator 124 may be implemented to clock the counter 140 until the pierce crystal oscillator 130 starts up and stabilizes. After the crystal oscillator has stabilized the counter 140 may start counting down with the RC clock RECLK. Additionally, the multiplexer 144 may select the clock CCLK(×2). The timer 103 may receive the clock CCLK(×2) that may be at 2 times the crystal oscillator frequency CCLK. The counter 140 may count down until a value of zero is reached. The timer clock CLK is generally then switched to the crystal frequency CCLK.

The timer 103 may provide accurate timing in response to the system clock CLK. From a point sufficiently far in time the timer 103, may provide the same number of clock pulses as if the crystal oscillator 130 had started instantaneously at power up.

Figure 3:
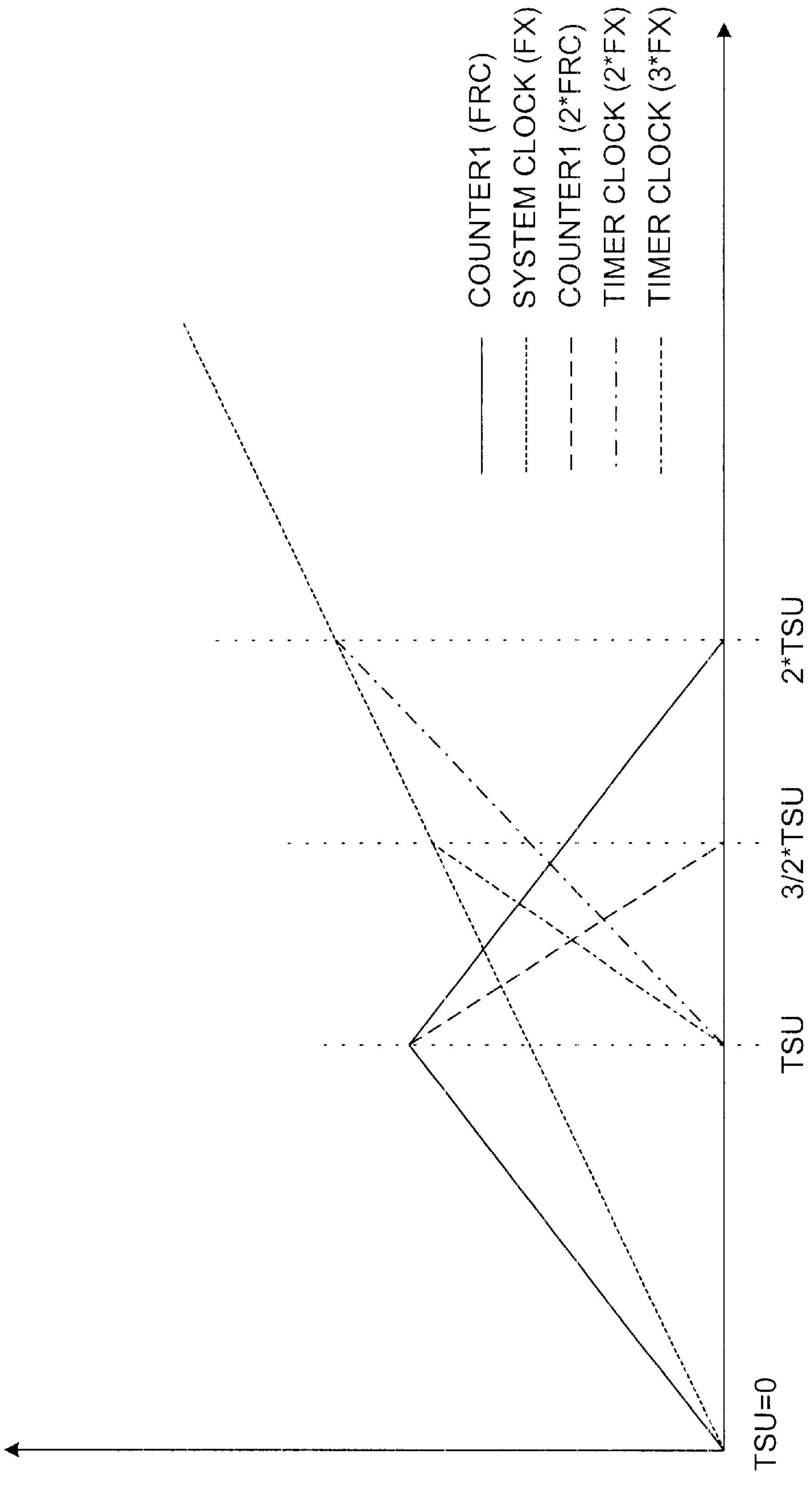
FIG. 3 is a graph illustrating various operations of the present invention.

Referring to FIG. 3, an example of an operation illustrating different times for different cases is shown.

At time=Tsu=0

VCC is generally applied the RC oscillator 124 generally starts the crystal oscillator 130 may not have yet started the counter 140 may start to count UP the counter 140 may be clocked by the signal RECLK (e.g., frc)

At time=Tsu (Start Up time)

the crystal clock CCLK generally stabilizes the timer CLK (e.g., and therefore the crystal clock CCLK) clock may be multiplied by 2 (e.g., 2*fx) or 3 (e.g., 3*fx)

the counter 140 may start counting DOWN the counter 140 may be clocked by the signal RECLK (e.g., frc) or 2*RECLK (e.g., 2*frc)

At time=3/2*Tsu the counter 140 may reach zero, if clocked by the signal 2*frc the timer clock CLK may be correctly compensated for, if clocked by the signal 3*fx At time=2*Tsu the counter 140 may reach zero, if clocked by the signal frc the timer clock CLK may be correctly compensated for, if clocked by the signal 2*fx The RC oscillator 124 generally starts immediately after power up at the time Tsu=0. The counter 140 may count up with the RC clock RECLK until the crystal oscillator 130 starts up and stabilizes (e.g., from time Tsu=0 to the time Tsu). At the time Tsu the counter 140 may have a crystal start up delay time. To convert the delay time into crystal clock pulses, the counter 140 may start counting down from the time Tsu either clocked by the signal RECLK or a multiple thereof. The timer clock CLK may be multiplied by 2 or 3 in order to reduce the dead time. When the counter 140 reaches zero at 3/2*Tsu or 2*Tsu, the timer 103 may receive the crystal frequency CCLK (via the multiplexer 144). After the time 3/2*Tsu or 2*Tsu, the total number of clocks that the timer 103 may have counted may be equal to the number of clocks that would have passed, if the pierce oscillator 130 had started instantaneously after power up.

The circuit 100 may have a dead time, a duration for which the timer 103 may not be accurate. The dead time may be due to two components (i) the crystal oscillator start up time and (ii) a count down time of the counter 140. The count down time may be reduced by increasing a count down frequency to multiples of the RC clock RECLK (e.g., 3*fx or 2*fx of FIG. 3). Additionally, the clock frequency CLK may need to be increased proportionately from the time Tsu until the time 3/2*Tsu or 2*Tsu.

The dead time (e.g., the point beyond which the start up time is not distinguishable) may be decreased by increasing the frequency at which the RC counter 140 counts down. The dead time may lie between Tsu (1+1/N) and 2*Tsu, where 'N' may be the frequency multiplication factor of the multiplier 126 while counting down with the frequency RECLK. Additionally, if the counter 140 is down counted with N*the frequency RECLK, then the frequency multiplication factor of the multiplier 134 may be 'K' which is generally equal to (N+1).

The circuit 100 may provide high accuracy from point of power applications to the chip. The circuit 100 may provide high accuracy over a wide voltage and temperature variation. The circuit 100 may provide an accurate timing of the timer 103 from power up.

The relaxation oscillator 124 may start up instantaneously after power up providing the counter 140 with the clock RECLK. The up/down counter 140 may track the time until the crystal oscillator 130 builds up. The up/down counter 140 may count up with the RC clock RECLK. The crystal oscillator 130 may start up after a few ms delay from power up. Additionally, the crystal oscillator clocks CCLK may be accurate once the crystal oscillator 130 builds up. The accurate clock CLK may be implemented as the system clock CLK for the timer 103.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

a first circuit comprising (i) a first oscillator circuit configured to generate a first clock, (ii) a second oscillator circuit configured to generate a plurality of second clocks, and a detect signal and (iii) a logic circuit configured to generate an output clock signal in response to said first clock, said plurality of second clocks and said detect signal, wherein said first circuit compensates for oscillation errors in said output clock after a power up; and a timer circuit configured to provide timing in response to said output clock signal.

2. The apparatus according to claim 1, wherein said first oscillator circuit is configured to operate instantaneously in response to said power up.

3. The apparatus according to claim 1, wherein said first oscillator circuit comprises a relaxation oscillator and said second oscillator circuit comprises a crystal oscillator.

4. The apparatus according to claim 1, wherein said logic circuit is configured to select one of said plurality of second clocks as said output clock signal in response to said detect signal.

5. The apparatus according to claim 1, wherein said second oscillator circuit is configured to generate said detect signal when said plurality of second clocks are stable.

6. The apparatus according to claim 1, wherein said first oscillator circuit is further configured to generate said first clock having a first frequency during a first period and a second frequency during a second period.

7. The apparatus according to claim 6, wherein said logic circuit is configured to present said output clock signal in response to (i) one of said plurality of second clocks during said second period and (ii) another of said plurality of second clocks after said second period.

8. The apparatus according to claim 1, wherein said second oscillator circuit comprises:

a crystal oscillator configured to generate one of said plurality of second clocks;

one or more multipliers configured to present at least one other of said plurality of second clocks; and a build up and detect circuit configured to generate said detect signal in response to at least one of said plurality of second clocks stabilizing.

9. The apparatus according to claim 6, wherein said logic circuit is further configured to switch between said plurality of second clocks after a period of time measured in response to said first clock.

10. The apparatus according to claim 9, wherein said logic circuit is further configured to switch from one of said plurality of second clocks to another of said plurality of second clocks in response to a count value.

11. The apparatus according to claim 10, wherein said count value is determined by an amount of time from said start up until said plurality of second clocks are stable.

12. The apparatus according to claim 10, wherein said logic circuit comprises:

a counter configured to generate said count value in response to said first clock;

a multiplexer configured to receive said plurality of second clocks and present said output clock signal; and a controller configured to control said counter and said multiplexer in response to said detect signal.

13. The apparatus according to claim 1, wherein said errors in said output clock occur during a build-up and stabilization time.

14. The apparatus according to claim 1, wherein said timer circuit is configured to present a measurement of time from said power up.

15. An apparatus comprising:

means for adjusting an output clock signal with (i) a first oscillator for generating a first clock and (ii) a second oscillator for generating a detect signal and a plurality of second clocks, wherein said output clock signal is compensated for oscillation errors in said output clock signal after a power up; and means for measuring time in response to said output clock signal.

16. The apparatus according to claim 15, wherein said errors in said output clock during a build-up and stabilization time.

17. A method for adjusting an output clock signal to compensate for oscillation errors occurring after a power up, comprising the steps of:

(A) providing time measurement in response to said output clock signal;

(B) generating a first clock in response to said power up;

(C) generating a plurality of second clocks and a detect signal; and (D) generating said output clock signal in response to said first clock, said detect signal and said plurality of second clocks, wherein said time measurement is compensated for oscillation errors in said output clock signal after said power up.

18. The method according to claim 15, wherein step (D) further comprises generating said detect signal after a build up and stabilization time of said plurality of second clocks.

19. The method according to claim 18, wherein step (D) further comprises switching between said plurality of second clock signals after a period of time determined by said build up and stabilization time.

20. The method according to claim 17, wherein step (D) further comprises switching between said plurality of second clocks in response to a count value.

21. An apparatus comprising:

a first circuit comprising (i) a first oscillator circuit configured to generate a first clock, (ii) a second oscillator circuit configured to generate a plurality of second clocks, and (iii) a logic circuit configured (a) to generate an output clock signal in response to said plurality of second clocks and (b) to measure a build-up and stabilization time of said second oscillator circuit, wherein said output clock signal has a first frequency during a period determined by said build-up and stabilization time and a second frequency after said period; and a timer circuit configured to provide timing in response to said output clock signal.

22. The apparatus according to claim 21, wherein said first frequency is a multiple of said second frequency and compensates for errors in said output clock signal that occur during said build-up and stabilization time.

* * * * *